United States Patent
Chou

(10) Patent No.: US 9,859,894 B1
(45) Date of Patent: Jan. 2, 2018

(54) LEVEL SHIFTING CIRCUIT AND INTEGRATED CIRCUIT

(71) Applicant: ELITE SEMICONDUCTOR MEMORY TECHNOLOGY INC., Hsinchu (TW)

(72) Inventor: Min-Chung Chou, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 15/415,978

(22) Filed: Jan. 26, 2017

(51) Int. Cl.
- *H03K 19/00* (2006.01)
- *H03K 19/0185* (2006.01)
- *H03K 3/356* (2006.01)
- *H03K 17/10* (2006.01)

(52) U.S. Cl.
CPC . *H03K 19/018528* (2013.01); *H03K 3/35613* (2013.01); *H03K 17/102* (2013.01); *H03K 19/018514* (2013.01); *H03K 19/018521* (2013.01)

(58) Field of Classification Search
CPC ..... H03K 3/356113; H03K 19/018521; H03K 17/102; H03K 19/0013; H03K 19/017509; H03K 3/356104; H03K 19/00315; H03K 19/017; H03K 19/0185; H03K 19/018507; H03K 19/01806; H03K 19/018571; H03K 3/35613; H03K 3/356156; H03K 19/018514; H03K 19/018528

See application file for complete search history.

(56) References Cited

U.S. PATENT DOCUMENTS

| | | | | |
|---|---|---|---|---|
| 6,930,518 B2* | 8/2005 | Kim | ................. | H03K 3/356165 326/68 |
| 7,053,657 B1* | 5/2006 | Peng | ................ | H03K 3/356113 326/68 |
| 7,151,400 B2* | 12/2006 | Chen | .................... | H03K 17/102 326/68 |
| 8,368,425 B2* | 2/2013 | Huang | ............. | H03K 3/356182 326/68 |
| 8,456,929 B2* | 6/2013 | Liles | ................ | H03K 3/356113 365/189.11 |
| 8,669,803 B2* | 3/2014 | Huang | ............. | H03K 3/356104 326/68 |
| 9,178,517 B2* | 11/2015 | Agrawal | ............ | H03K 19/0185 |

(Continued)

*Primary Examiner* — Vibol Tan
(74) *Attorney, Agent, or Firm* — Li & Cai Intellectual Property (USA) Office

(57) ABSTRACT

In exemplary embodiments of the present disclosure, a level shifting circuit and an integrated circuit using the level shifting circuit are provided. Compared to the conventional level shifting circuit, the level shifting circuit herein further has another pair of PMOS transistors and another pair of NMOS transistors, wherein the other pair of the PMOS transistors is connected to the pair of the PMOS transistors, and the other pair of the NMOS transistors is connected to the pair of the NMOS transistors. PMOS and NMOS transistors of the level shifting circuit are protected, the lifetime of the level shifting circuit is increased, and the damage probability of the level shifting circuit is decreased. The other pair of the PMOS transistors being turned on can be operated in the saturation region rather than in the linear region, such that the operation speed of the level shifting circuit is enhanced.

18 Claims, 3 Drawing Sheets

(56) References Cited

U.S. PATENT DOCUMENTS

| | | | | |
|---|---|---|---|---|
| 9,584,125 B2* | 2/2017 | Tsuji | .............. | H03K 19/018521 |
| 9,647,660 B1* | 5/2017 | Alam | ................ | H03K 19/00361 |
| 2015/0295561 A1* | 10/2015 | Malkov | .......... | H03K 19/018507 |
| | | | | 327/333 |
| 2015/0381180 A1* | 12/2015 | Tsuji | .............. | H03K 19/018521 |
| | | | | 327/319 |

* cited by examiner

LEVEL SHIFTING CIRCUIT AND INTEGRATED CIRCUIT

BACKGROUND

1. Technical Field

The instant disclosure relates to a level shifting circuit for shifting a first logic high level of input voltages to generate a second logic high level of output voltages, and to an integrated circuit using the level shifting circuit.

2. Description of Related Art

In modern integrated circuit design, the logical core and the input/output unit may be powered by distinct voltages. For example, in an integrated circuit manufactured by a 0.13 μm process technique, the logical core may be powered by a power of 1.2 volts, and the input/output unit is powered by a power of 3.3 volts. Because signals of the logical core operate within a first voltage range (e.g. 0 through 1.2 volts) and signals of the input/output unit operate within a second voltage range (e.g. 0 through 3.3 volts), a level shifting circuit is generally required to ensure that the signals conveyed between the logical core and the input/output unit are at correct logical states.

Referring to FIG. 1, FIG. 1 is a circuit diagram showing a conventional level shifting circuit. The conventional level shifting circuit 1 comprises a pair of N-type metal-oxide-semiconductor (NMOS) transistors N1, N2, and a pair of P-type metal-oxide-semiconductor (PMOS) transistors P1, P2. The input voltages IN_1 and IN_2 are input to the conventional level shifting circuit 1, and the conventional level shifting circuit 1 generates the output voltages OUT_1 and OUT_2 according to the input voltages IN_1 and IN_2, wherein the input voltage IN_2 is the inversion of the input voltage IN_1, and the output voltage OUT_2 is the inversion of the output voltage OUT_1. A first logic high level of the input voltages IN_1 and IN_2 is not the same as a second logic high level of the output voltages OUT_1 and OUT_2. For example, the first logic high level of the input voltages IN_1 and IN_2 is 1.2 volts, and the second logic high level of the output voltages OUT_1 and OUT_2 is 3.3 volts. That is, the conventional level shifting circuit 1 shifts first logic high level of the input voltages IN_1 and IN_2 to the second logic high level of the output voltages OUT_1 and OUT_2 so as to generate the output voltages OUT_1 and OUT_2.

The details of the circuit structure associated with the conventional level shifting circuit 1 are illustrated as follows. Source ends of the NMOS transistors N1 and N2 are connected to a low voltage with a logic low level, such as ground voltage GND. Gate ends of the NMOS transistors N1 and N2 respectively receive the input voltages IN_1 and IN_2. A drain end of the PMOS transistor P1 is connected to a drain end of the NMOS transistor N1 and a gate end the PMOS transistor P2, and a drain end of the PMOS transistor P2 is connected to a drain end of the NMOS transistor N2 and a gate end the PMOS transistor P1. Source ends of the PMOS transistors P1 and P2 are connected to a high voltage with the second logic high level, such as system voltage VDD. The drain end of the PMOS transistor P2 is used to deliver the output voltage OUT_1, and the drain end of the PMOS transistor P1 is used to deliver the output voltage OUT_2.

By above circuit structure of the conventional level shifting circuit 1, in a first situation, during a transient period, when the input voltage IN_1 changes to the first logic high level from the logic low level, and the input voltage IN_2 changes to the logic low level from the first logic high level, the NMOS transistor N1 is turned on, and the NMOS transistor N2 is turned off. Since the NMOS transistor N1 is turned on, the output voltage OUT_2 is pulled down to the ground voltage GND from the second logic high level (i.e. VDD), and then the PMOS transistor P2 is turned on when the output voltage OUT_2 has decreased to the level which the system voltage subtracts a threshold voltage VTP of the PMOS transistor P2. Since the PMOS transistor P2 is turned on, the output voltage OUT_1 is pushed up to the system voltage VDD with the second logic high level from the ground voltage GND (i.e. the logic low level), and the PMOS transistor P1 is turned off when the output voltage OUT_1 has increased to the level which the system voltage subtracts a threshold voltage VTP of the PMOS transistor P1 (i.e. VDD–VTP). After the output voltage OUT_1 is equal to the system voltage VDD and the output voltage OUT_2 is equal to the ground voltage GND, the transient period elapses and a steady period begins.

In the first situation, during the steady period, a drain-source voltage of the NMOS transistor N2 being turned off is the system voltage VDD, a gate-source voltage of the NMOS transistor N1 being turned on is the first logic high level, a drain-source voltage of the PMOS transistor P1 being turned off is the system voltage VDD, and a gate-source voltage of the PMOS transistor P2 being turned on is the system voltage VDD. The PMOS transistor P1 suffers the high drain-source voltage, the PMOS transistor P2 suffers the high gate-source voltage, and the NMOS transistor N2 suffers the high drain-source voltage, such that the PMOS transistors P1, P2 and the NMOS transistor N2 have large damage probability, or lifetimes of the PMOS transistors P1, P2 and the NMOS transistor N2 may be reduced.

It is noted that, in the first situation, during the transient period, before the output voltage OUT_1 has increased to the level which the system voltage VDD subtracts the threshold voltage VTP of the PMOS transistor P1 (i.e. VDD–VTP), the PMOS transistor P1 is not turned off and the NMOS transistor N1 is turned on, such that the output voltage OUT_2 cannot be rapidly pulled down to the ground voltage GND, and the output voltage OUT_1 cannot be rapidly pushed up to the system voltage VDD with the second logic high level.

In a second situation, during a steady period, the input voltage IN_2 has first logic high level and the input voltage IN_1 has the logic low level, the NMOS transistor N2 and the PMOS transistor P1 are turned on, and the NMOS transistor N1 and the PMOS transistor P2 are turned off, such that the output voltage OUT_2 is the system voltage VDD with the second logic high level, and the output voltage OUT_1 is the ground voltage GND with the logic low level. The PMOS transistor P2 suffers the high drain-source voltage, the PMOS transistor P1 suffers the high gate-source voltage, and the NMOS transistor N1 suffers the high drain-source voltage, such that the PMOS transistors P1, P2 and the NMOS transistor N1 have large damage probability, or lifetimes of the PMOS transistors P1, P2 and the NMOS transistor N1 may be reduced.

It is noted that, in the second situation, during a transient period, before the output voltage OUT_2 is increased to the level which the system voltage VDD subtracts the threshold voltage of the PMOS transistor P2 (i.e. VD–VTP), the PMOS transistor P2 is not turned off, and the NMOS transistor N2 is turned on, such that the output voltage OUT_1 cannot be rapidly pulled down to the ground voltage GND, and the output voltage OUT_2 cannot be rapidly pushed up to the system voltage VDD with the second logic high level.

A common manner for solving the problem of a low operation speed in both of the first and second situations is to increase channel lengths of the PMOS transistors P1 and P2. However, this common manner increases a size of the conventional level shifting circuit 1.

SUMMARY

An exemplary embodiment of the instant disclosure provides a level shifting circuit, and the level shifting circuit comprises a first through fourth NMOS transistors and a first through fourth PMOS transistors. The first NMOS transistor has a gate end for receiving a first input voltage, a source end connected to a first logic low level, and a drain end. The second NMOS transistor has a gate end for receiving a second input voltage, a source end connected to the first logic low level, and a drain end, wherein the second input voltage is an inversion of the first input voltage. The third NMOS transistor has a gate end connected to a first logic high level, a source end connected to the drain end of the first NMOS transistor, and a drain end. The fourth NMOS transistor has a gate end connected to the first logic high level, a source end connected to the drain end of the second NMOS transistor, and a drain end. The first PMOS transistor has a gate end, a source end connected to a second logic high level, and a drain end. The second PMOS transistor has a gate end, a source end connected to the second logic high level, and a drain end, wherein the drain end of the second PMOS transistor is connected to the gate end of the first PMOS transistor and used to deliver a first output voltage, the drain end of the first PMOS transistor is connected to the gate end of the second PMOS transistor and used to deliver a second output voltage, and the second output voltage is an inversion of the first output voltage. The third PMOS transistor has a gate end for receiving the second input voltage, a source end connected to the drain end of the first PMOS transistor, and a drain end connected to the drain end of the third NMOS transistor. The fourth PMOS transistor has a gate end for receiving the first input voltage, a source end connected to the drain end of the second PMOS transistor, and a drain end connected to the drain end of the fourth NMOS transistor.

An exemplary embodiment of the instant disclosure provides an integrated circuit. The integrated circuit comprises a first block utilizing the first logic high level for presenting logic 1, a second block utilizing the second logic high level for presenting logic 1, and the above level shifting circuit. The level shifting circuit connected between the first block and the second block is used to shift the first logic high level to the second logic high level.

The level shifting circuit and the integrated circuit provided in the exemplary embodiments of the present disclosure have the high operation speed, the long lifetime, and the low damage probability.

For further understanding of the instant disclosure, reference is made to the following detailed description illustrating the embodiments of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

Figure 1:
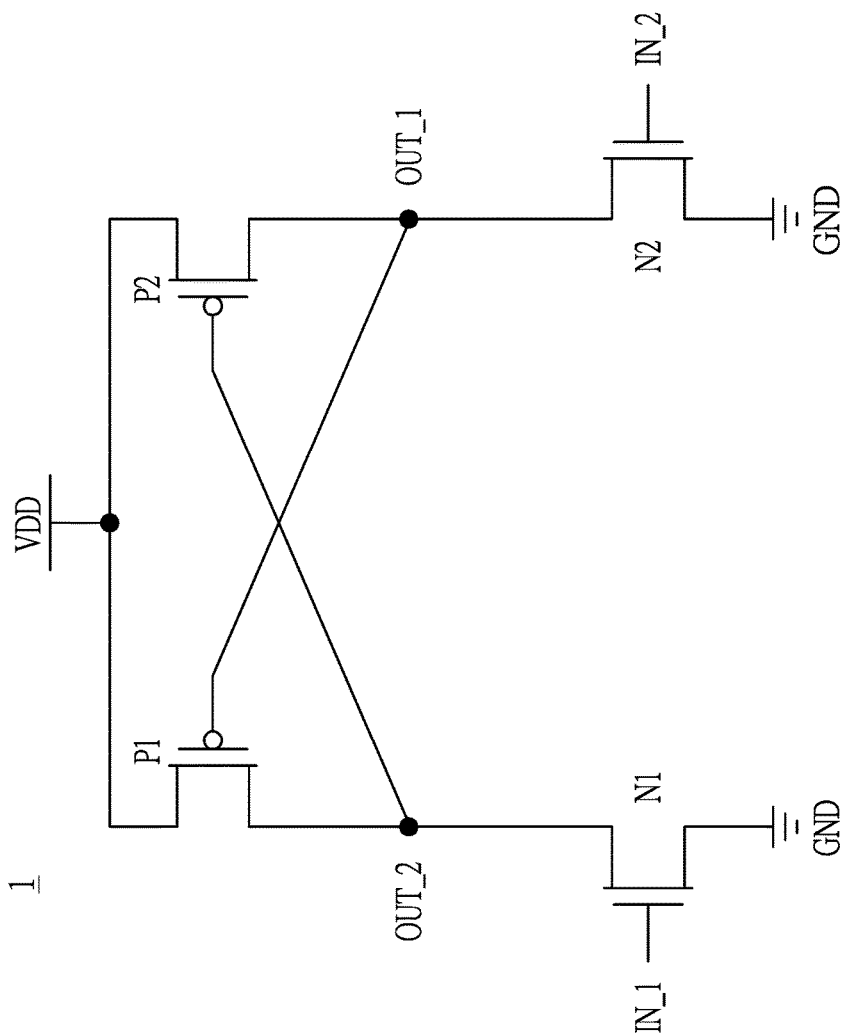
FIG. 1 is a circuit diagram showing a conventional level shifting circuit.

The aforementioned illustrations and following detailed descriptions are exemplary for the purpose of further explaining the scope of the instant disclosure. Other objectives and advantages related to the instant disclosure will be illustrated in the subsequent descriptions and appended drawings.

It will be understood that, although the terms first, second, third, and the like, may be used herein to describe various elements, but these elements should not be limited by these terms. These terms are only to distinguish one element from another region or section discussed below could be termed a second element without departing from the teachings of the instant disclosure. As used herein, the term "and/or" includes any and all combinations of one or more of the associated listed items.

Exemplary Embodiment of Level Shifting Circuit

In one exemplary embodiment of the present disclosure, a level shifting circuit is provided. Compared to the conventional level shifting circuit, the level shifting circuit herein further has another pair of PMOS transistors and another pair of NMOS transistors, wherein the other pair of the PMOS transistors is connected to the pair of the PMOS transistors, and the other pair of the NMOS transistors is connected to the pair of the NMOS transistors.

The other pair of the PMOS transistors and the other pair of the NMOS transistors can reduce the drain-source voltages and the gate-source voltage of the pair of the PMOS transistors, and reduce the drain-source voltages of the pair of the NMOS transistors. Furthermore, the drain-source voltages and the gate-source voltages of the other pair of the PMOS transistors and the other pair of the NMOS transistors are not large. Therefore, plurality of PMOS transistors and plurality of NMOS transistors in the level shifting circuit are protected, the lifetime of the level shifting circuit is increased, and the damage probability of the level shifting circuit is decreased.

It is noted that by the circuit structure of the level shifting circuit according to the exemplary embodiment of the present disclosure, the other pair of the PMOS transistors being turned on can be operated in the saturation region rather than in the linear region, such that the operation speed of the level shifting circuit is enhanced.

Moreover, the level shifting circuit further comprises an output stage circuit, wherein the output stage circuit comprises two PMOS transistors and a NMOS transistor. In the output stage circuit, the two PMOS transistors are serially connected to each other, one of the two PMOS transistors acts as a diode, and the NMOS transistor is connected to the PMOS transistor acting as the diode. One of two input voltages is input to a gate end of the NMOS transistor in the output stage circuit, and a gate end of the PMOS transistor not acting as the diode in the output stage circuit is connected to a drain end of corresponding one PMOS transistor in the pair of the PMOS transistors. Additionally, an output capacitor can be disposed between the connection point of the two PMOS transistors of the output stage circuit and a ground voltage.

Figure 2:
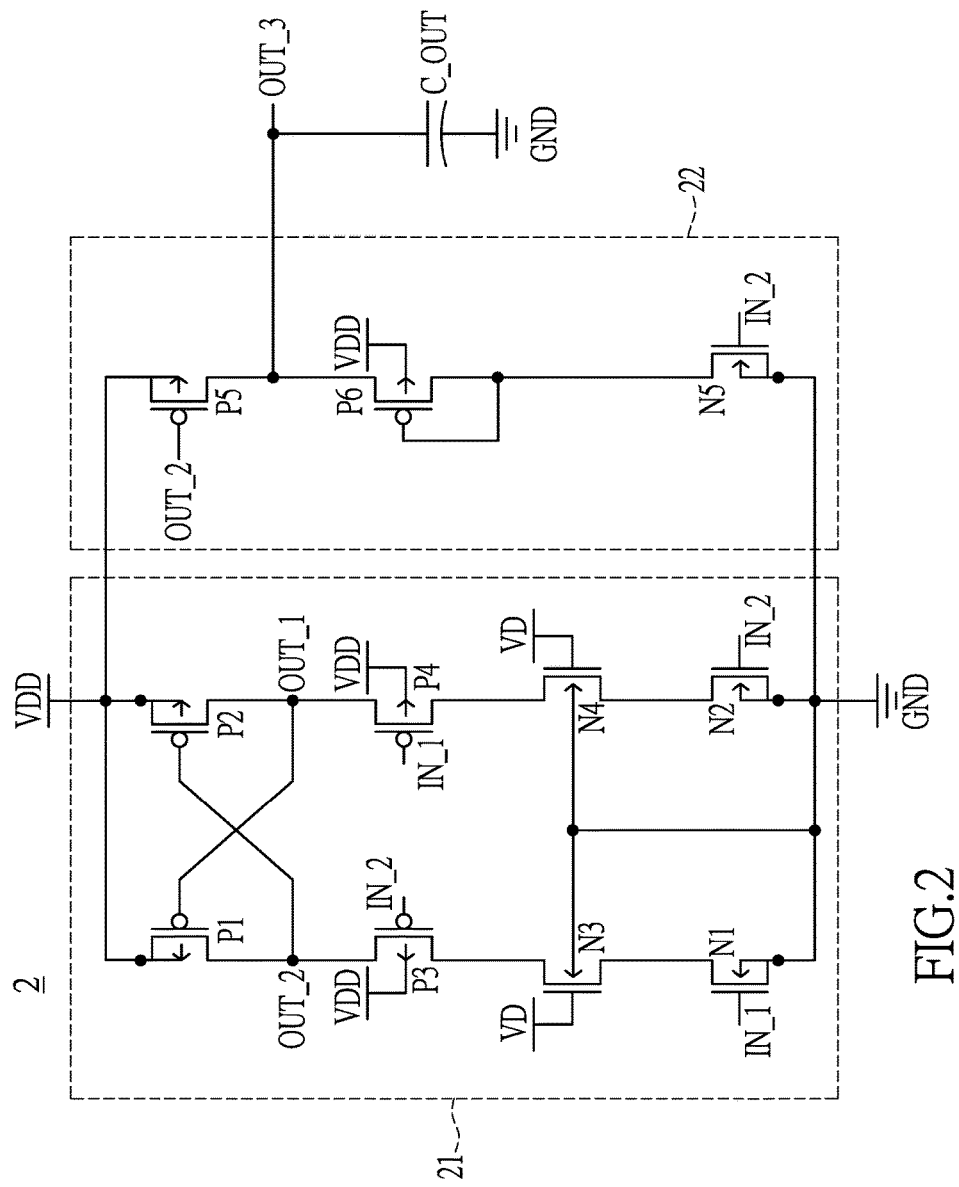
FIG. 2 is a circuit diagram showing a level shifting circuit according to an exemplary embodiment of the present disclosure.

Please refer to FIG. 2. FIG. 2 is a circuit diagram showing a level shifting circuit according to an exemplary embodiment of the present disclosure. The level shifting circuit 2 comprises a level shifting unit 21, an output stage circuit 22, and an output capacitor C_OUT. The output stage circuit 22 is connected to the level shifting unit 21 and the output capacitor C_OUT. It is noted that the output stage circuit 22 and the output stage circuit 22 can be removed therefrom in one other exemplary embodiment, and that is, the output stage circuit 22 and the output stage circuit 22 are not essential components of the level shifting circuit 2.

The level shifting unit 21 receives the input voltages IN_1 and IN_2, and the input voltage IN_2 is the inversion of the input voltage IN_1. A first logic high level of the input voltages IN_1 and IN_2 is a level of a voltage VD. The level shifting unit 21 is used to shift the first logic high level to a second logic high level of the output voltages OUT_1 and OUT_2, and to deliver the output voltage OUT_1 and OUT_2, wherein the second logic high level can be a level of a system voltage VDD, and the output voltage OUT_2 is the inversion of the output voltage OUT_1. The output stage circuit 22 receives the output voltage OUT_2 and the input voltage IN_2 to generate an output voltage OUT_3 across the output capacitor C_OUT. Furthermore, the first logic low level of the input voltages IN_1 and IN_2 is not same as the second logic low level of the output voltages OUT_1 and OUT_2.

The level shifting unit 21 comprises a first pair of PMOS transistors P1, P2, a second pair of PMOS transistors P3, P4, a first pair of NMOS transistors N1, N2, and a second pair of NMOS transistors N3, N4. The first pair of the PMOS transistors P1, P2 is connected to the second pair of the PMOS transistors P3, P4, the second pair of the PMOS transistors P3, P4 is connected to the second pair of the NMOS transistors N3, N4, and the second pair of the NMOS transistors N3, N4 is connected to the first pair of the NMOS transistors N1, N2. That is, the first pair of PMOS the transistors P1, P2, the second pair of PMOS the transistors P3, P4, the second pair of the NMOS transistors N3, N4, and the first pair of the NMOS transistors N1, N2 are disposed in a serial connection.

The first pair of the PMOS transistors P1, P2 acts as a latch, and generates the output voltages OUT_2 and OUT_1 at drain ends of first pair of the PMOS transistors P1, P2. The second pair of PMOS the transistors P3, P4, receive the input voltages IN_2 and IN_1, and the first pair of the NMOS transistors N1, N2 receive the input voltage IN_1 and IN_2. The second pair of the NMOS transistors N3, N4 receives the voltage VD with the first logic high level.

In a first situation, when the input voltage IN_1 changes to the first logic high level from a first logic low level, the output voltage OUT_1 is pushed up to the system voltage VDD with the second logic high level from a threshold voltage VTP of the PMOS transistor P4. In a second situation, when the input voltage IN_2 changes to the first logic high level from a first logic low level, the output voltage OUT_2 is pushed up to the system voltage VDD with the second logic high level from a threshold voltage VTP of the PMOS transistor P3.

Specifically, a gate end of the NMOS transistor N1 receives the input voltage IN_1, and a gate end of the NMOS transistor N2 receives the input voltage IN_2. Source ends of the NMOS transistors N1 and N2 are connected to a low voltage with the first logic low level, such as the ground voltage GND. A drain end of the NMOS transistor N1 is connected to a source end of the NMOS transistor N3, and a drain end of the NMOS transistor N2 is connected to a source end of the NMOS transistor N4. The gate ends of the NMOS transistors N3 and N4 receive the voltage VD with the first logic high level.

A drain end of the NMOS transistor N3 is connected to a drain end of the PMOS transistor P3, and a drain end of the NMOS transistor N4 is connected to a drain end of the PMOS transistor P4. The gate end of the PMOS transistor P3 receives the input voltage IN_2, and the gate end of the PMOS transistor P4 receives the input voltage IN_1. A source end of the PMOS transistor P3 is connected to the drain end of the PMOS transistor P1, and a source end of the PMOS transistor P4 is connected to the drain end of the PMOS transistor P2.

A gate end of the PMOS transistor P2 is connected to the drain end of the PMOS transistor P1, and a gate end of the PMOS transistor P1 is connected to the drain end of the PMOS transistor P2. The output voltages OUT_1 and OUT_2 are delivered from the drain ends of the PMOS transistors P2 and P1 respectively. Source ends of the PMOS transistors P1 and P2 are connected to the system voltage VDD with the second logic high level. Body ends of the NMOS transistors N1 through N4 are connected to the ground voltage GND. Body ends of the PMOS transistors P1 through P4 are connected to the system voltage VDD with the second logic high level.

By the circuit structure of the level shifting unit 21, in the first situation, during a transient period, when the input voltage IN_1 changes to the first logic high level (i.e. the level of the voltage VD) from the first logic low level (i.e. the level of the ground voltage GND) and the input voltage IN_2 changes to the first logic low level from the first logic high level, the NMOS transistor N1 is turned on, and the NMOS transistor N2 is turned off. Meanwhile, the NMOS transistor N3 and the PMOS transistor P3 is turned on, thus the voltage at the drain end of the NMOS transistor N1 (or the voltage at the source end of the NMOS transistor N3) is pulled down to the ground voltage GND from a level which the first logic high level subtracts a threshold voltage VTN of the NMOS transistor N3 (i.e. VD−VTN), the voltage at the drain ends of the PMOS transistor P3 and the NMOS transistor N3 is pulled down to the ground voltage GND from the system voltage VDD, and the output voltage OUT_2 is pulled down to the threshold voltage VTP of the PMOS transistor P3 from the system voltage VDD.

When the output voltage OUT_2 has decreased to a level which the system voltage VDD subtracts a threshold voltage VTP of the PMOS transistor P2 (i.e. VDD−VTP), the PMOS transistor P2 is turned on, and then the output voltage OUT_1 is pushed up to the system voltage VDD with the second logic high level from a threshold voltage VTP of the PMOS transistor P4.

When the output voltage OUT_1 has increased to a level which the first logic high level adds the threshold voltage VTP of the PMOS transistor P4 (i.e. VD+VTP), the PMOS transistor P4 and the NMOS transistor N4 are turned on, such that the voltage at the drain ends of the NMOS transistor N4 and the PMOS transistor P4 is pushed up to the system voltage VDD from the ground voltage GND, and the voltage at the source end of the NMOS transistor N4 (or the voltage at the drain end of the NMOS transistor N2) is pushed up to the first logic high level minus a threshold voltage VTN of the NMOS transistor N4 (i.e. VD−VTN) from the ground voltage GND.

When the output voltage OUT_1 has increased to a level which the system voltage VDD subtracts a threshold voltage VTP of the PMOS transistor P1 (i.e. VDD−VTP), the PMOS transistor P1 is turned off. After the output voltage OUT_2 is equal to the threshold voltage VTP of the PMOS transistor P3 and the output voltage OUT_1 is equal to the system voltage VDD with second logic high level, the transient period elapses, and a steady period begins.

In the first situation, during the steady period, the output voltages OUT_2 and OUT_1 are equal to the threshold voltage VTP of the PMOS transistor P3 (i.e. the second logic low level) and the system voltage VDD with second logic high level respectively, the voltage at the drain end of the PMOS transistor P3 (or the voltage at the drain end of the voltage at the NMOS transistor N3) is equal to the ground voltage GND, and the voltage at the source end of the NMOS transistor N3 (or the voltage at the drain end of the NMOS transistor N1) is also equal to the ground voltage GND. The voltage at the drain end of the PMOS transistor P4 (or the voltage at drain end of the NMOS transistor N4) is equal to the lager one of the system voltage VDD and the first logic high level added with threshold voltage VTP of the PMOS transistor P4; that is, Max (VDD, VD+VTP). The voltage at the source end of the NMOS transistor N4 (or the voltage at the drain end of the NMOS transistor N2) is equal to the level which the first logic high level subtracts the threshold voltage VTN of the NMOS transistor N4 (VD−VTN). In practice, the difference between the first logic high level VDD and the second logic high level VD is much larger than the threshold voltage VTP. In other words, VDD>>VD+VTP, and thus VDD=Max (VDD, VD+VTP).

In the first situation, during the steady period, a drain-source voltage of the PMOS transistor P1 being turned off is the level which the system voltage VDD subtracts the threshold voltage VTP of the PMOS transistor P3 (i.e. VDD−VTP), and a gate-source voltage of the PMOS transistor P2 being turned on is the level which the system voltage VDD subtracts the threshold voltage VTP of the PMOS transistor P3 (i.e. VDD−VTP). A drain-source voltage and a gate-source voltage of the PMOS transistor P3 being turned on are the threshold voltage VTP of the PMOS transistor P3, and a drain-source voltage and a gate-source voltage of the PMOS transistor P4 being turned on are respectively 0 and the level which the system voltage VDD subtracts the first logic high level (i.e. VDD−VD).

A drain-source voltage of the NMOS transistor N3 being turned on is 0, and a gate-source voltage of the NMOS transistor N3 being turned on is the first logic high level (i.e. VD). A drain-source voltage of the NMOS transistor N4 being turned on is the level which the system voltage VDD subtracts first logic high level and adds the threshold voltage VTN of the NMOS transistor N4 (i.e. VDD−(VD−VTN)), and a gate-source voltage of the NMOS transistor N4 being turned on is the threshold voltage VTN of the NMOS transistor N4. A drain-source voltage of the NMOS transistor N1 being turned on is 0, and a gate-source voltage of the NMOS transistor N1 being turned on is the first logic high level (i.e. VD). A drain-source voltage of the NMOS transistor N2 being turned off is a level which the first logic high level subtracts the threshold voltage VTN of the NMOS transistor N4 (i.e. VD−VTN), and a gate-source voltage of the NMOS transistor N2 being turned off is 0.

In the second situation, during a transient period, the input voltage IN_2 changes to the first logic high level (i.e. the level of the voltage VD) from the first logic low level (i.e. the level of the ground voltage GND) and the input voltage IN_1 changes to the first logic low level from the first logic high level, the NMOS transistor N2 is turned on, and the NMOS transistor N1 is turned off. Meanwhile, the NMOS transistor N4 and the PMOS transistor P4 is turned on, thus the voltage at the drain end of the NMOS transistor N2 (or the voltage at the source end of the NMOS transistor N4) is pulled down to the ground voltage GND from the voltage with the level which the first logic high level subtracts a threshold voltage VTN of the NMOS transistor N4 (i.e. VD−VTN), the voltage at the drain ends of the PMOS transistor P4 and the NMOS transistor N4 is pulled down to the ground voltage GND from the system voltage VDD, and the output voltage OUT_1 is pulled down to the threshold voltage VTP of the PMOS transistor P4 from the system voltage VDD.

When the output voltage OUT_1 has decreased to a level which the system voltage VDD subtracts a threshold voltage VTP of the PMOS transistor P1 (i.e. VDD−VTP), the PMOS transistor P1 is turned on, and then the output voltage OUT_2 is pushed up to the system voltage VDD with the second logic high level from a threshold voltage VTP of the PMOS transistor P3.

When the output voltage OUT_2 has increased to a level which the first logic high level adds the threshold voltage VTP of the PMOS transistor P3 (i.e. VD+VTP), the PMOS transistor P3 and the NMOS transistor N3 are turned on, such that the voltage at the drain ends of the NMOS transistor N3 and the PMOS transistor P3 is pushed up to the system voltage VDD from the ground voltage GND, and the voltage at the source end of the NMOS transistor N3 (or the voltage at the drain end of the NMOS transistor N1) is pushed up to the first logic high level minus a threshold voltage VTN of the NMOS transistor N3 (i.e. VD−VTN) from the ground voltage GND.

When the output voltage OUT_2 has increased to a level which the system voltage VDD subtracts a threshold voltage VTP of the PMOS transistor P2 (i.e. VDD−VTP), the PMOS transistor P2 is turned off. After the output voltage OUT_1 is equal to the threshold voltage VTP of the PMOS transistor P4 and the output voltage OUT_2 is equal to the system voltage VDD with second logic high level, the transient period elapses, and a steady period begins.

In the second situation, during the steady period, the output voltages OUT_1 and OUT_2 are equal to the threshold voltage VTP of the PMOS transistor P4 (i.e. the second logic low level) and the system voltage VDD with second logic high level respectively, the voltage at the drain end of the PMOS transistor P4 (or the voltage at the drain end of the NMOS transistor N4) is equal to the ground voltage GND, and the voltage at the source end of the NMOS transistor N4 (or the voltage at the drain end of the NMOS transistor N2) is also equal to the ground voltage GND. The voltage at the drain end of the PMOS transistor P3 (or the voltage at drain end of the NMOS transistor N3) is equal to the system voltage VDD, and the voltage at the source end of the NMOS transistor N3 (or the voltage at the drain end of the NMOS transistor N1) is equal to the level which the first logic high level subtracts the threshold voltage VTN of the NMOS transistor N3 (VD−VTN).

In the second situation, during the steady period, a drain-source voltage of the PMOS transistor P2 being turned off is the level which the system voltage VDD subtracts the threshold voltage VTP of the PMOS transistor P4 (i.e. VDD−VTP), and a gate-source voltage of the PMOS transistor P1 being turned on is the level which the system voltage VDD subtracts the threshold voltage VTP of the PMOS transistor P4 (i.e. VDD−VTP). A drain-source voltage and a gate-source voltage of the PMOS transistor P4 being turned on are the threshold voltage VTP of the PMOS transistor P4, and a drain-source voltage and a gate-source voltage of the PMOS transistor P3 being turned on are respectively 0 and the level which the system voltage VDD subtracts the first logic high level (i.e. VDD−VD).

A drain-source voltage of the NMOS transistor N4 being turned on is 0, and a gate-source voltage of the NMOS transistor N4 being turned on is the first logic high level (i.e. VD). A drain-source voltage of the NMOS transistor N3 being turned on is the level which the system voltage VDD subtracts first logic high level and adds the threshold voltage VTN of the NMOS transistor N3 (i.e. VDD−(VD−VTN)), and a gate-source voltage of the NMOS transistor N3 being turned on is the threshold voltage VTN of the NMOS transistor N3. A drain-source voltage of the NMOS transistor N2 being turned on is 0, and a gate-source voltage of the NMOS transistor N2 being turned on is the first logic high level (i.e. VD). A drain-source voltage of the NMOS transistor N1 being turned off is a level which the first logic high level subtracts the threshold voltage VTN of the NMOS transistor N3 (i.e. VD−VTN), and a gate-source voltage of the NMOS transistor N1 being turned off is 0.

It is obvious that, by the circuit structure of the level shifting unit 21, the drain-source voltages and the gate-source voltages suffered by the PMOS transistors P1 and P2 can be reduced, and the drain-source voltages suffered by the NMOS transistors N1 and N2 can be also reduced. Furthermore, the gate-source voltages and the drain-source voltages suffered by the NMOS transistors N3, N4, and the PMOS transistors P3, P4 are not large. Therefore, the level shifting unit 21 makes the level shifting circuit 2 has large life time and low damage probability. Moreover, the NMOS transistors N3 and N4 are operated in the saturation region rather than the linear region, and one of the PMOS transistors P3 and P4 is also operated in the saturation region, therefore increasing the operation speed of the level shifting unit 21 and the level shifting circuit 2.

The output stage circuit 22 comprises two PMOS transistors P5, P6, and a NMOS transistor N5. A source end of the PMOS transistor P5 is connected to the system voltage VDD, a gate end of the PMOS transistor P5 receives the output voltage OUT_2, and a drain end of the PMOS transistor P5 is connected to a source end of the PMOS transistor P6. A gate end of the PMOS transistor P6 is connected to a drain end of the PMOS transistor P6, and the drain end of the PMOS transistor P6 is connected to drain end of the NMOS transistor N5. A gate end of the NMOS transistor N5 receives the input voltage IN_2, and a source end of the NMOS transistor N5 is connected to the ground voltage GND. Body ends of the PMOS transistors P5 and P6 are connected to the system voltage VDD, and a body end of the NMOS transistor N5 is connected to the ground voltage GND. One end of output capacitor C_OUT is connected to the source end of the PMOS transistor P6 and the drain end of the PMOS transistor P5, and other one end of the output capacitor C_OUT is connected to the ground voltage GND.

In the first situation, during the transient period, the NMOS transistor N5 is turned off, and the PMOS transistor P6 is turned on and acting as the diode. When the output voltage OUT_2 has decreased to the level which the system voltage VDD subtracts the threshold voltage VTP of the PMOS transistor P5 (i.e. VDD−VTP), the PMOS transistor P5 is turned on. The output voltage OUT_3 is pulled to the system voltage VDD from the threshold voltage VTP of the PMOS transistor P6 (i.e. the second logic low level), and the voltage at the drain ends of the PMOS transistor P6 and the NMOS transistor N5 is pulled to the system voltage VDD minus the threshold voltage of the PMOS transistor P6 (i.e. VDD−VTP) from the ground voltage GND. During the steady period, the output voltage OUT_3 is equal to the system voltage VDD with the second logic high level, and the voltage at the drain ends of the PMOS transistor P6 and the NMOS transistor N5 is equal to the system voltage VDD minus the threshold voltage of the PMOS transistor P6.

In the second situation, during the transient period, the NMOS transistor N5 is turned on, and the PMOS transistor P6 is turned on and acting as the diode. When the output voltage OUT_2 has increased to the level which the system voltage VDD subtracts the threshold voltage VTP of the PMOS transistor P5 (i.e. VDD−VTP), the PMOS transistor P5 is turned off. The output voltage OUT_3 is pulled down to the threshold voltage VTP of the PMOS transistor P6 from the system voltage VDD, and the voltage at the drain ends of the PMOS transistor P6 and the NMOS transistor N5 is pulled down ground voltage GND from the system voltage VDD minus the threshold voltage of the PMOS transistor P6 (i.e. VDD−VTP). During the steady period, the output voltage OUT_3 is equal to the threshold voltage VTP of the PMOS transistor P6 (i.e. the second logic low level), and the voltage at the drain ends of the PMOS transistor P6 and the NMOS transistor N5 is equal to ground voltage GND.

In short, the output stage circuit 22 acts as a buffer for buffering the output voltage OUT_2. Moreover, during the steady period of the first situation or the second situation, the gate-source voltage and the drain-source of the PMOS transistor P6 are the threshold voltage VTP of the PMOS transistor P6. During the steady period of the first situation, the drain-source voltage and the gate-source voltage of PMOS transistor P5 being turned on are respectively 0 and the system voltage VDD minus the threshold voltage VTP of the PMOS transistor P3 (i.e. VDD−VTP), and the drain-source voltage and the gate-source voltages of NMOS transistor N5 being turned off are respectively the system voltage VDD minus the threshold voltage VTP of the PMOS transistor P6 (i.e. VDD−VTP) and 0. During the steady period of the second situation, the drain-source voltage and the gate-source voltages of PMOS transistor P5 being turned off are respectively the system voltage VDD minus the threshold voltage VTP of the PMOS transistor P6 and 0, and the drain-source voltage and the gate-source voltages of NMOS transistor N5 being turned on are respectively 0 and the first logic high level (i.e. VD).

That is, the drain-source voltage and the gate-source voltage suffered by the PMOS transistors P5 can be reduced, the drain-source voltage suffered by the NMOS transistor N5 can be reduced, and the PMOS transistor P6 suffers the low drain-source voltage and gate-source voltage. Therefore, the output stage circuit 21 has the long lifetime, and the low damage probability.

Exemplary Embodiment of Integrated Circuit

The above level shifting circuit can be used in an integrated circuit needing signals with different logic high levels, and the integrated circuit can be a memory integrated circuit, an audio processing integrated circuit, or other integrated circuit, for example. That is, the level shifting circuit shifts the first logic high level of one block to the second logic high level of the other one block, and vice versa. The two blocks can be a logic core and an input/output unit, but the present disclosure is not limited thereto.

Figure 3:
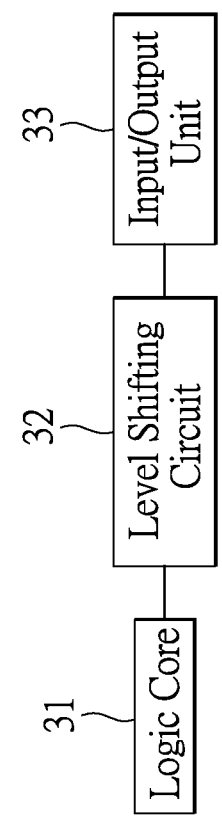
FIG. 3 is a block diagram showing an integrated circuit according to an exemplary embodiment of the present disclosure.

Please refer to FIG. 3. FIG. 3 is a block diagram showing an integrated circuit according to an exemplary embodiment of the present disclosure. The integrated circuit 3 comprises a logic core 31, a level shifting circuit 32, and an input/output unit 33. The level shifting circuit 32 is connected between the logic core 31 and the input/output unit 33. The logic core 31 utilizes a first logic high level for presenting logic 1, and the input/output unit 33 utilizes a second logic high level for presenting logic 1, wherein the first logic high level is not the same as the second logic high level, and the first logic high level and the second logic high level for example can be 1.2 volts and 3.3 volts respectively while the integrated circuit 3 is manufactured by the 0.13 μm process technique.

The level shifting circuit 32 can be one of the level shifting circuit mentioned above, and is used to shift the first logic high level of logic core 31 to the second logic high level of the input/output unit 33, or shift the second logic high level of the input/output unit 33 to the first logic high level of logic core 31. Therefore, the signals conveyed between the logical core 31 and the input/output unit 33 can be at correct logical states. Moreover, as mentioned above, the level shifting circuit 32 has the high operation speed, the long lifetime, and the low damage probability, thus the integrated circuit 3 also has the high operation speed, the long lifetime, and the low damage probability.

TECHNICAL RESULT

To sum up, the level shifting circuit and the integrated circuit provided in the exemplary embodiments of the present disclosure has the high operation speed, the long lifetime, and the low damage probability, since plurality of NMOS transistors and plurality PMOS transistors therein are protected, and some NMOS transistors therein are operated in the saturation region rather than the linear region.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A level shifting circuit, comprising:
a first N-type metal-oxide-semiconductor (NMOS) transistor having a gate end for receiving a first input voltage, a source end connected to a first logic low level, and a drain end;
a second NMOS transistor having a gate end for receiving a second input voltage, a source end connected to the first logic low level, and a drain end, wherein the second input voltage is an inversion of the first input voltage;
a third NMOS transistor having a gate end connected to a first logic high level, a source end connected to the drain end of the first NMOS transistor, and a drain end;
a fourth NMOS transistor having a gate end connected to the first logic high level, a source end connected to the drain end of the second NMOS transistor, and a drain end;
a first P-type metal-oxide-semiconductor (PMOS) transistor having a gate end, a source end connected to a second logic high level, and a drain end;
a second PMOS transistor having a gate end, a source end connected to the second logic high level, and a drain end, wherein the drain end of the second PMOS transistor is connected to the gate end of the first PMOS transistor and used to deliver a first output voltage, the drain end of the first PMOS transistor is connected to the gate end of the second PMOS transistor and used to deliver a second output voltage, and the second output voltage is an inversion of the first output voltage;
a third PMOS transistor having a gate end for receiving the second input voltage, a source end connected to the drain end of the first PMOS transistor, and a drain end connected to the drain end of the third NMOS transistor;
a fourth PMOS transistor having a gate end for receiving the first input voltage, a source end connected to the drain end of the second PMOS transistor, and a drain end connected to the drain end of the fourth NMOS transistor;
a fifth PMOS transistor having a gate end for receiving the second output voltage, a source end connected to the second logic high level, and a drain end for delivering a third output voltage;
a fifth NMOS transistor having a gate end for receiving the second input voltage, a source end connected to the first logic low level, and a drain end; and
a sixth PMOS transistor having a gate end, a source end connected to the drain end of the fifth PMOS transistor, and a drain end connected to the gate end of the sixth PMOS transistor and the drain end of the fifth NMOS transistor.

2. The level shifting circuit according to claim 1, further comprising:
an output capacitor having two ends respectively connected to the drain end of the fifth PMOS transistor and the first logic low level.

3. The level shifting circuit according to claim 1, wherein body ends of the first through sixth PMOS transistors are connected to the second logic high level, and body ends of the first through fifth transistors are connected to the first logic low level.

4. The level shifting circuit according to claim 1, wherein the third NMOS transistor and the fourth NMOS transistor are operated in a saturation region, and one of the third PMOS transistor and the fourth PMOS transistor is operated in the saturation region.

5. The level shifting circuit according to claim 1, wherein during a transient period in a first situation, when the first input voltage have changed to the first logic high level from the first logic low level and the second input voltage changed to the first logic low level from the first logic high level, the first PMOS transistor, the second NMOS transistor, and the fifth NMOS transistor are turned off, the first NMOS transistor, the third NMOS transistor, the fourth NMOS transistor, and the second through sixth PMOS transistors are turned on, such that the first output voltage and the third output voltage are equal to the second logic high level, and the second output voltage is equal to a threshold voltage of the third PMOS transistor.

6. The level shifting circuit according to claim 5, wherein during the steady period in the first situation: a drain-source voltage of the first PMOS transistor is a level which the second logic high level subtracts the threshold voltage of the third PMOS transistor, and a gate-source voltage of the second PMOS transistor is the level which the second logic high level subtracts the threshold voltage of the third PMOS transistor; a drain-source voltage and a gate-source voltage of the third PMOS transistor are the threshold voltage of the third PMOS transistor, and a drain-source voltage and a gate-source voltage of the fourth PMOS transistor are respectively 0 and a level which the second logic high level subtracts the first logic high level; a drain-source voltage of the third NMOS transistor is 0, a gate-source voltage of the third NMOS transistor is the first logic high level, a drain-source voltage of the fourth NMOS transistor is a level which the second logic high level subtracts first logic high level and adds a threshold voltage of the fourth NMOS transistor, and a gate-source voltage of the fourth NMOS transistor is the threshold voltage of the fourth NMOS transistor; a drain-source voltage of the first NMOS transistor is 0, a gate-source voltage of the first NMOS transistor is the first logic high level, a drain-source voltage of the second NMOS transistor is a level which the first logic high level subtracts the threshold voltage of the fourth NMOS transistor, and a gate-source voltage of the second NMOS transistor is 0.

7. The level shifting circuit according to claim 1, wherein during a transient period in a second situation, when the second input voltage have changed to the first logic high level from the first logic low level and the first input voltage changed to the first logic low level from the first logic high level, the second PMOS transistor, the first NMOS transistor, and the fifth PMOS transistor are turned off, the second through fifth NMOS transistors, the first PMOS transistor, the three and fourth PMOS transistors, and the sixth PMOS transistor are turned on, such the second output voltage is equal to the second logic high level, the first output voltage is equal to a threshold voltage of the fourth PMOS transistor, and the third output voltage is equal to a threshold voltage of the sixth PMOS transistor, wherein the threshold voltage of the sixth PMOS transistor is a second logic low level.

8. The level shifting circuit according to claim 7, wherein during the steady period in the second situation: a drain-source voltage of the second PMOS transistor is a level which the second logic high level subtracts the threshold voltage of the fourth PMOS transistor, and a gate-source voltage of the first PMOS transistor is the level which the second logic high level subtracts the threshold voltage of the fourth PMOS transistor; a drain-source voltage and a gate-source voltage of the fourth PMOS transistor are the threshold voltage of the fourth PMOS transistor, and a drain-source voltage and a gate-source voltage of the third PMOS transistor are respectively 0 and a level which the second logic high level subtracts the first logic high level; a drain-source voltage of the fourth NMOS transistor is 0, a gate-source voltage of the fourth NMOS transistor is the first logic high level, a drain-source voltage of the third NMOS transistor is a level which the second logic high level subtracts first logic high level and adds a threshold voltage of the third NMOS transistor, and a gate-source voltage of the third NMOS transistor is the threshold voltage of the third NMOS transistor; a drain-source voltage of the second NMOS transistor is 0, a gate-source voltage of the second NMOS transistor is the first logic high level, a drain-source voltage of the first NMOS transistor is a level which the first logic high level subtracts the threshold voltage of the third NMOS transistor, and a gate-source voltage of the first NMOS transistor is 0.

9. An integrated circuit, comprising:
a first block, utilizing a first logic high level for presenting logic 1;
a second block, utilizing a second logic high level for presenting logic 1; and
a level shifting circuit connected between the first block and the second block, used to shift the first logic high level to the second logic high level, comprising:

a first N-type metal-oxide-semiconductor (NMOS) transistor having a gate end for receiving a first input voltage, a source end connected to a first logic low level, and a drain end;
a second NMOS transistor having a gate end for receiving a second input voltage, a source end connected to the first logic low level, and a drain end, wherein the second input voltage is an inversion of the first input voltage;
a third NMOS transistor having a gate end connected to the first logic high level, a source end connected to the drain end of the first NMOS transistor, and a drain end;
a fourth NMOS transistor having a gate end connected to the first logic high level, a source end connected to the drain end of the second NMOS transistor, and a drain end;
a first PMOS transistor having a gate end, a source end connected to a second logic high level, and a drain end;
a second PMOS transistor having a gate end, a source end connected to the second logic high level, and a drain end, wherein the drain end of the second PMOS transistor is connected to the gate end of the first PMOS transistor and used to deliver a first output voltage, the drain end of the first PMOS transistor is connected to the gate end of the second PMOS transistor and used to deliver a second output voltage, and the second output voltage is an inversion of the first output voltage;
a third PMOS transistor having a gate end for receiving the second input voltage, a source end connected to the drain end of the first PMOS transistor, and a drain end connected to the drain end of the third NMOS transistor;
a fourth PMOS transistor having a gate end for receiving the first input voltage, a source end connected to the drain end of the second PMOS transistor, and a drain end connected to the drain end of the fourth NMOS transistor;
a fifth PMOS transistor having a gate end for receiving the second output voltage, a source end connected to the second logic high level, and a drain end for delivering a third output voltage;
a fifth NMOS transistor having a gate end for receiving the second input voltage, a source end connected to the first logic low level, and a drain end; and
a sixth PMOS transistor having a gate end, a source end connected to the drain end of the fifth PMOS transistor, and a drain end connected to the gate end of the sixth PMOS transistor and the drain end of the fifth NMOS transistor.

10. The integrated circuit according claim 9, wherein the first block is a logic core, and the second block is an input/output (input/output) unit; or alternatively, the first block is the input/output unit, and the second block is the logic core.

11. The integrated circuit according to claim 10, wherein the integrated circuit is the memory integrated circuit.

12. The integrated circuit according to claim 9, wherein the level shifting circuit further comprises:
an output capacitor having two ends respectively connected to the drain end of the fifth PMOS transistor and the first logic low level.

13. The integrated circuit according to claim 9, wherein body ends of the first through sixth PMOS transistors are connected to the second logic high level, and body ends of the first through fifth transistors are connected to the first logic low level.

14. The integrated circuit according claim 9, wherein the third NMOS transistor and the fourth NMOS transistor are operated in a saturation region, and one of the third PMOS transistor and the fourth PMOS transistor is operated in the saturation region.

15. The integrated circuit according claim 9, wherein during a steady period in a first situation, when the first input voltage have changed to the first logic high level from the first logic low level and the second input voltage changed to the first logic low level from the first logic high level, the first PMOS transistor, the second NMOS transistor, and the fifth NMOS transistor are turned off, the first NMOS transistor, the third NMOS transistor, the fourth NMOS transistor, and the second through sixth PMOS transistors are turned on, such that the first output voltage and the third output voltage are equal to the second logic high level, and the second output voltage is equal to a threshold voltage of the third PMOS transistor.

16. The integrated circuit according claim 15, wherein during the steady period in the first situation: a drain-source voltage of the first PMOS transistor is a level which the second logic high level subtracts the threshold voltage of the third PMOS transistor, and a gate-source voltage of the second PMOS transistor is the level which the second logic high level subtracts the threshold voltage of the third PMOS transistor; a drain-source voltage and a gate-source voltage of the third PMOS transistor are the threshold voltage of the third PMOS transistor, and a drain-source voltage and a gate-source voltage of the fourth PMOS transistor are respectively 0 and a level which the second logic high level subtracts the first logic high level; a drain-source voltage of the third NMOS transistor is 0, a gate-source voltage of the third NMOS transistor is the first logic high level, a drain-source voltage of the fourth NMOS transistor is a level which the second logic high level subtracts first logic high level and adds a threshold voltage of the fourth NMOS transistor, and a gate-source voltage of the fourth NMOS transistor is the threshold voltage of the fourth NMOS transistor; a drain-source voltage of the first NMOS transistor is 0, a gate-source voltage of the first NMOS transistor is the first logic high level, a drain-source voltage of the second NMOS transistor is a level which the first logic high level subtracts the threshold voltage of the fourth NMOS transistor, and a gate-source voltage of the second NMOS transistor is 0.

17. The integrated circuit according claim 9, wherein during a steady period in a second situation, when the second input voltage have changed to the first logic high level from the first logic low level and the first input voltage changed to the first logic low level from the first logic high level, the second PMOS transistor, the first NMOS transistor, and the fifth PMOS transistor are turned off, the second through fifth NMOS transistors, the third PMOS transistor, the fourth PMOS transistor, and the sixth PMOS transistor are turned on, such the second output voltage is equal to the second logic high level, the first output voltage is equal to a threshold voltage of the fourth PMOS transistor, and the third output voltage is equal to a threshold voltage of the sixth PMOS transistor, wherein the threshold voltage of the sixth PMOS transistor is a second logic low level.

18. The integrated circuit according claim 17, wherein during the steady period in the second situation: a drain-source voltage of the second PMOS transistor is a level which the second logic high level subtracts the threshold voltage of the fourth PMOS transistor, and a gate-source voltage of the first PMOS transistor is the level which the second logic high level subtracts the threshold voltage of the fourth PMOS transistor; a drain-source voltage and a gate-source voltage of the fourth PMOS transistor are the threshold voltage of the fourth PMOS transistor, and a drain-source voltage and a gate-source voltage of the third PMOS transistor are respectively 0 and a level which the second logic high level subtracts the first logic high level; a drain-source voltage of the fourth NMOS transistor is 0, a gate-source voltage of the fourth NMOS transistor is the first logic high level, a drain-source voltage of the third NMOS transistor is a level which the second logic high level subtracts first logic high level and adds a threshold voltage of the third NMOS transistor, and a gate-source voltage of the third NMOS transistor is the threshold voltage of the third NMOS transistor; a drain-source voltage of the second NMOS transistor is 0, a gate-source voltage of the second NMOS transistor is the first logic high level, a drain-source voltage of the first NMOS transistor is a level which the first logic high level subtracts the threshold voltage of the third NMOS transistor, and a gate-source voltage of the first NMOS transistor is 0.

* * * * *